United States Patent
Tabatowski-Bush et al.

(10) Patent No.: US 10,983,165 B2
(45) Date of Patent: Apr. 20, 2021

(54) FRONT END PASS SWITCH FOR BATTERY MONITORING CIRCUIT

(71) Applicant: Ford Global Technologies, LLC, Dearborn, MI (US)

(72) Inventors: Benjamin A. Tabatowski-Bush, South Lyon, MI (US); John Paul Gibeau, Canton, MI (US); Chingchi Chen, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 290 days.

(21) Appl. No.: 16/029,832

(22) Filed: Jul. 9, 2018

(65) Prior Publication Data
US 2020/0011934 A1    Jan. 9, 2020

(51) Int. Cl.
| G01R 31/36 | (2020.01) |
| H01M 10/48 | (2006.01) |
| H01M 10/42 | (2006.01) |
| G01R 31/364 | (2019.01) |
| G01R 31/382 | (2019.01) |

(52) U.S. Cl.
CPC ......... *G01R 31/364* (2019.01); *G01R 31/382* (2019.01); *H01M 10/425* (2013.01); *H01M 10/486* (2013.01); *H01M 2010/4271* (2013.01)

(58) Field of Classification Search
CPC . G01R 31/364; G01R 31/382; H01M 10/425; H01M 10/486; H01M 2010/4271; H01M 10/48; H01M 2220/20; H01M 10/482; H01M 10/4257; H01M 10/441
See application file for complete search history.

(56) References Cited

U.S. PATENT DOCUMENTS

| 9,024,586 B2 | 5/2015 | Vance et al. | |
| 9,340,122 B2 | 5/2016 | Yamauchi et al. | |
| 9,484,753 B2 | 11/2016 | Bui-Van et al. | |
| 2003/0027036 A1* | 2/2003 | Emori | H02J 7/0031 429/61 |
| 2012/0242144 A1* | 9/2012 | Chorian | H01M 2/34 307/9.1 |
| 2014/0197682 A1* | 7/2014 | Tabatowski-Bush | B60L 58/10 307/9.1 |
| 2015/0084404 A1* | 3/2015 | Hashim | B60L 15/08 307/9.1 |
| 2017/0012444 A1* | 1/2017 | Kamei | H02J 7/0016 |
| 2017/0062878 A1 | 3/2017 | Povey et al. | |

* cited by examiner

*Primary Examiner* — Patrick Assouad
*Assistant Examiner* — Haidong Zhang
(74) *Attorney, Agent, or Firm* — David B. Kelley; Brooks Kushman P.C.

(57) ABSTRACT

A battery system has a cell, a substrate mounted on the cell, and monitoring circuitry on the substrate and exclusively powered by the cell. The battery system also has a switch on the substrate electrically between the cell and monitoring circuit, and control circuitry on the substrate. The control circuitry, responsive to a value of a parameter of the cell measured by the monitoring circuitry falling outside a predefined range, opens the switch to electrically disconnect the monitoring circuit from the cell.

11 Claims, 7 Drawing Sheets

Fig-1

_Fig-2_

_Fig-3_

FRONT END PASS SWITCH FOR BATTERY MONITORING CIRCUIT

TECHNICAL FIELD

This disclosure relates to circuitry for monitoring battery cell data.

BACKGROUND

Some alternatively powered vehicles include traction batteries and electric motors for propulsion. Because traction batteries are sometimes controlled according to temperature data or voltage data for example, circuits can be used to monitor state of the traction batteries.

SUMMARY

A battery system has a cell, a substrate mounted on the cell, monitoring circuitry on the substrate and exclusively powered by the cell, a switch on the substrate electrically between the cell and monitoring circuit, and control circuitry on the substrate. The control circuitry, responsive to a value of a parameter of the cell measured by the monitoring circuitry falling outside a predefined range, opens the switch to electrically disconnect the monitoring circuit from the cell.

A battery system has a cell, a battery monitoring circuit exclusively powered by the cell and that measures data about the cell, a switch electrically between the cell and battery monitoring circuit, and control circuitry that, responsive to a voltage of the cell falling outside a predefined voltage range, opens the switch to electrically disconnect the battery monitoring circuit from the cell.

A battery system has a cell, a substrate mounted on the cell, monitoring circuitry on the substrate, exclusively powered by the cell, and that measures data about the cell, a switch on the substrate electrically between the cell and monitoring circuit, and control circuitry on the substrate that, responsive to a signal, opens the switch to electrically disconnect the monitoring circuit from the cell.

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

Figure 1:
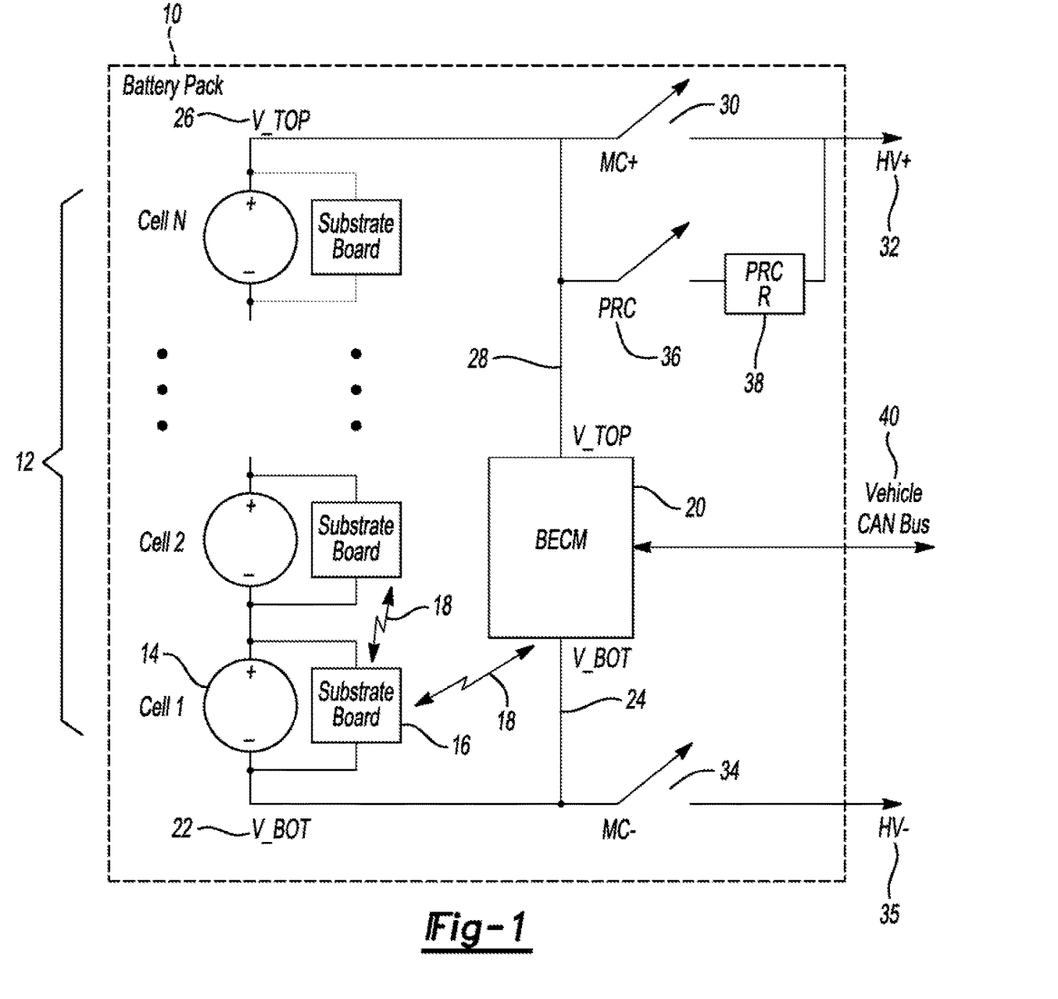
FIG. 1 is a schematic diagram of a battery pack with N cells in series.

Referring to FIG. 1, battery pack 10 contains a series stack of cells 12 starting at the lowest cell in the string, Cell 1, 14, which is connected to Cell 2, and so on up to Cell N, which is the top cell in the string. Here, the N cells are series connected. This is a usual arrangement for cells in a full hybrid, which could be described as "Ns1p," which means a cell string just one cell wide or "1p" with N of these "1p" units stacked on top of each other. As an example, N may be 60 for a full hybrid, so 60s1p would describe these 60 cells in one long series string, and nothing in parallel. Now if one had a string which was 2 cells wide, or "2p" and if there were 120 cells available, and the most basic unit is 2 cells in parallel or "2p," then it is possible to stack in series 60 groups of two cells in parallel. In this instance, when we stack all 2-cell parallel groupings in series on top of each other, called 60s2p, the resulting pack has the same voltage as 60s1p (for which the pack voltage is the nominal cell voltage times 60), but the pack's capacity is double that of a 60s1p.

From the perspective of the battery electronics hardware, a pack arrangement of 60s1p works the same as 60s2p, since there are still just 60 voltages to be measured. The reason for this is because for each of the 2 cells placed in parallel, only one voltage needs to be measured. Since there are 60 series-stacked instances of the 2p parallel unit, there are 60 voltages overall to be measured in the whole pack. The ordinary arrangement for a battery electric vehicle might be to use, for instance, a series combination of 96 voltages to be read wherein each unit is 5 cells in parallel, which would be a 96s5p. The total number of cells for this example battery electric vehicle is 96*5=480 cells. Notice that what is proposed works for any type of electrified vehicle, and while FIG. 1 specifically depicts the situation with N cells in series, this approach works regardless of the width "in parallel" of the pack—which means that a Ns1p has the same hardware setup as a Ns5p, for example.

The battery pack 10 could be for any sort of an electrified vehicle, ranging from mild hybrid, value hybrid, full hybrid, plug in hybrid, battery electric vehicle, or any other sort of vehicle that needs a traction battery that calls for the monitoring of individual cell voltages (although again, for cells that are in parallel with each other, only one voltage needs to be measured). A noteworthy feature is the existence of a small substrate board 16, which is a small circuit assembly, on FR4, ceramic, or some other suitable material, that contains the circuitry needed for sensing the voltage and temperature of the cell 14 and transferring this information over an RF Link 18 between the substrate board 16 and a central battery energy control module (BECM) 20. The RF link 18, which is implemented with radio frequency communications, may use a purely wireless medium between the substrate board 16 and central module 20, using antenna emissions from the substrate board 16 coupling energy to a receiving antenna on the BECM 20, or it may use the medium of the high voltage bus in the battery pack 10. For instance, the cell string 14 as mentioned above is connected in a series string. The (−) terminal on Cell 1 could be referred to as V_BOT 22, which means the lowest potential of the cell string 14. This same node is connected through a wire 24 to the V_BOT node of the BECM 20. Similarly, the (+) terminal of Cell N is connected to a node referred to as V_TOP 26. This node is connected to the BECM 20 through a wire 28 to the V_TOP terminal of the BECM 20. In this fashion, the BECM 20 is connected to the high voltage bus coming from the cell stack 14 consisting of all cells from Cell 1 to Cell N. Since both the cell string 12 and BECM 20 are connected to the same high voltage bus 24, 28 they can use the high voltage bus 24, 28 as a medium that allows RF energy to travel from the substrate board 16 (or any of the other substrate boards), through the wiring connecting all the cells to each other, through the high voltage bus wiring 24, 28 and to the BECM 20. This high voltage bus is a wired medium, but this wired medium may also carry RF energy from the substrate board 16 (or any other the other substrate boards) to the central module 20. In fact, for the radio frequency link between a given substrate board to the central module 20, some fraction of the signal energy may travel through antenna radiation 18, and some other fraction of the signal energy may travel through the high voltage bus 24, 28. Accordingly, the system designer will arrange the RF communication circuits on substrate boards and the matching RF communication circuits in the BECM 20 in such a way that RF propagation might happen in any proportion between the wired high voltage bus link from the cell string 14 to the V_TOP and V_BOT pins on the BECM 20, or in the wireless medium between the substrate board 16 and BECM 20.

It should be noted that any substrate board may communicate using the RF link 18. That is, the RF communication circuit on the substrate board 16 not only can communicate with the BECM 20, but also can communicate via RF to any other substrate board in the same pack. The same discussion above regarding the possibility of using a wireless medium between the two communicating substrate boards, or of using the high voltage bus that connects the given two communicating substrate boards, applies. Now in practice, each substrate board might be able to best reach nearby substrate boards using an RF link, but may have a more difficult time reaching faraway substrate boards for numerous reasons such as signal strength, the efficiency of the RF channel between the sending and receiving substrate board, and so on. Therefore, a method known as mesh networking is employed, wherein the route that a message takes progressing from one substrate board to the central BECM 20 may take several hops, which means that the originating substrate board sends out a message on the RF link to another nearby substrate board, and it will forward it to a substrate board which is closer to the central BECM 20 and so on, until the message reaches a substrate board which has an excellent RF link with the BECM 20. At that point, the message is sent from the last substrate board in the mesh link to the central BECM 20. The process can work in reverse, wherein the central BECM 20 sends a message to a nearby substrate board, and then the messages is forwarded along multiple links using the same sort of mesh networking concepts, until the message arrives at the board which is addressed in the message. For a system that is properly set up to utilize mesh networking, there is no functional difference between a situation in which a given substrate board has a direct RF link between itself and the central BECM 20, and a situation where the communicating substrate board should mesh network with a number of hops equal to the number of substrate boards in the battery pack 10. Now, it is conceivable that the hop limit, or the number of hops that a message can traverse before being discarded, could be set to larger than the number of substrate boards in the battery pack 10. However, this approach may lead to inefficient use of the RF spectrum considering that every time mesh networking is employed to pass a message from one substrate board to another substrate board, a certain amount of the available RF spectrum is used up. That is, if at a given moment in time a substrate board has an available link to the central BECM 20, and it has a message which is addressed to the BECM 20, it should preferentially send that message to the BECM 20 rather than forward it to some other substrate board node which will continue the usage of the mesh networking mechanism and as well, continue to consume RF spectrum. The most efficient usage of the RF spectrum will occur in situations where mesh networking is not needed at all, for instance in a system wherein each substrate board node is always able to transmit and receive messages directly from the central BECM 20. But, since this is not always the case, the system can be set up with mesh networking capability so that if under some circumstances a substrate board may not be able to directly reach the BECM 20 through an RF link, the message can be sent to a nearby substrate board to utilize mesh networking. This usage of mesh networking concepts inside the battery pack 10 is why this technology may be called battery pack sensing module peer to peer, which means that a network is formed among the peer substrate boards to overcome any deficiencies in the RF link from a given substrate board to the central BECM 20.

There are a few other items in FIG. 1 worth mentioning. Positive main contactor MC+ 30 connects (and disconnects) the cell string 14 to the rest of the vehicle as node HV+ 32 is under the control of the BECM 20. That is, the BECM 20 has a contactor drive circuit, connected to the coil of the MC+ contactor 30, that can open and close the MC+ contactor 30 under the control of software executing in the BECM 20. In a similar fashion, negative main contactor MC− 34 connects the lowest potential in the cell string 14 to vehicle HV bus node HV− 35 under the control of software executing in BECM 20. A feature of the battery pack 10 is to pre-charge the HV bus before closing the main contactor MC+ 30. Pre-charge contactor PRC 36 and pre-charge resistor 38 are utilized for this HV bus pre-charge.

A typical contactor close sequence, to progress the battery pack 10 from all contactors open to having the HV bus 32, 35 connected, would be to first close the MC− 34 and PRC 36 at the same time, which will pre-charge the HV bus 32, 35 through the pre-charge resistance PRC 38. The BECM 20 can monitor the voltage on the vehicle HV bus 32, 35. When this HV bus voltage is close in voltage to the pack voltage V_TOP 26 with respect to V_BOT 22, for instance within 20V, then pre-charge is successful and the MC+ 30 can be closed. It should be noted that the BECM 20 is on the vehicle CAN bus 40 and through the CAN bus 40 communications occur between the BECM 20 and the rest of the vehicle. Other modules in the vehicle make the determination when it is desired to connect the high voltage traction battery pack 10 to the HV bus 32, 35 and they send CAN messages through the vehicle CAN bus 40 to the BECM 20. The BECM 20 uses the vehicle CAN bus 40 to coordinate with the other modules in the vehicle.

Figure 2:
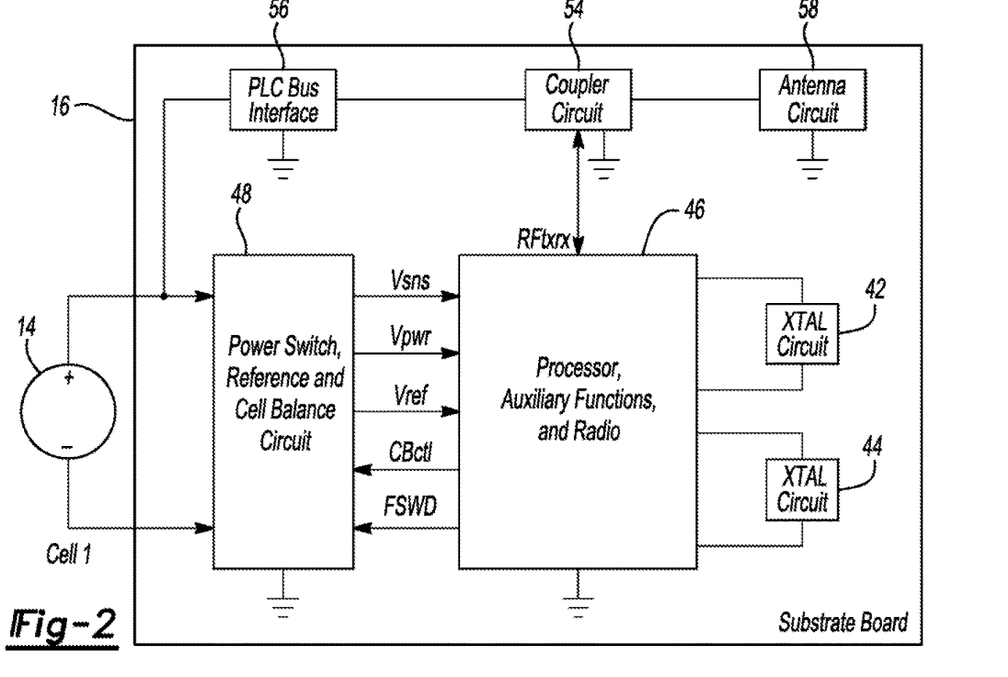
FIG. 2 is a schematic diagram of one of the substrate boards of FIG. 1.

Referring to FIG. 2, we discover lower level details about the substrate board 16, which can be made of a suitable substrate material such as FR4 or ceramic as mentioned above. It may be desirable to make the substrate board 16 as small, reliable, and inexpensive as possible since the vehicle bears the cost of N of these substrate boards for N cells (in the event of a single series string such as Ns1p configuration.) Ideally, all the functions and circuits depicted on FIG. 2 would be able to be contained in a single monolithic piece of silicon, to reduce cost and improve reliability. However, there are many reasons which would lead to a small number of components to be mounted on the substrate board 16. The first reason that more than one component may be needed on the substrate board 16 is because of the crystals 42 and 44. The crystal 42, for example 24 MHz, may be used to regulate the frequency used in the RF circuit. This 24 MHz crystal may be used with a phase locked loop (PLL) to multiply the oscillations to obtain an RF carrier frequency. The 24 Mhz oscillations may also be subdivided down via a digital circuit as needed if the RF carrier is desired to be lower than 24 Mhz. On the other hand, the crystal 44, for example 32.768 kHz, may be used as a low power real time clock (RTC). This type of crystal is called a watch crystal and is common for circuits that need to keep time. The crystal 44 is optional in certain implementations because the processor 46 may have a simple low power RC oscillator built in that is able to keep time when the circuits on the substrate board 16 are sleeping. The key difference between the use of the optional watch crystal 44 and a built-in RC oscillator in the processor 46 is that the watch crystal 44 is quite accurate, for instance +−20 PPM. This level of accuracy will only lead to about 12 seconds of error per week. However, if the internal RC timer inside the processor 46 is used, the accuracy is about 8 percent. An application for which excellent accuracy during sleep is required would be if the substrate board 16 is sleeping most of the time, and wakes up exactly at the right moments to transmit data about Cell 1. The idea is that all the cells in a pack from 1 to N would be sleeping and each one would wake up at just the right moment into order to transmit in the correct timeslot. This approach leads to the lowest current draw from each cell.

All the power to run the electronics on the substrate board 16 comes from Cell 1. If the goal is to minimize current consumption from the cell, then it would be considered advantageous to minimize the current draw and sleeping most of the time would accomplish this. However, it is true that when an electrified vehicle is charging or driving, it is not a problem to have the system put energy into the traction battery, and there is no special need to minimize the current draw from the substrate board 16. For example, if the average current can be held at 10 mA or less, this would be a typical current load on, for example, a lithium battery as imposed by a typical battery monitoring integrated circuit. The amount of operating current draw from this type of monitoring electronics is not a problem to the system. What can be a problem to the system is if the operating currents differ from one cell to the next. When the current draw is different from one cell to the next, then the cell balancing feature of the substrate board comes into play.

To sum up the concept for the optional watch crystal 44, the choice to include a watch crystal will be related to the desire to minimize the current draw out of the cells by having the electronics sleep most of the time, except during the moments when the radio in the circuit block 46 is transmitting. However, many applications will be able to leave the power applied to the substrate board 16 when the battery pack 10 is operating and utilize the relatively accurate clock offered by the crystal 42. The crystal 42 will be utilized when the substrate board 16 is transmitting and therefore is drawing full power.

Figure 3:
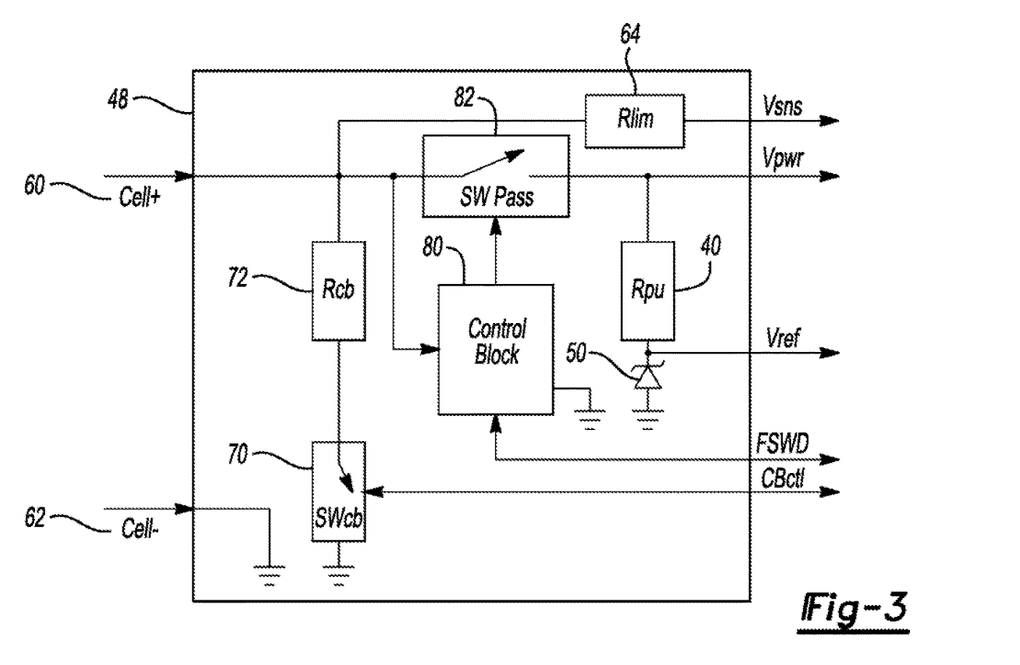
FIG. 3 is a schematic diagram of the power switch, reference, and cell balance circuit of FIG. 3.

Another optional choice for the system is a precision reference that is contained in the cell balance, power switch, and reference circuit 48. This precision reference is the "reference" in the circuit 48. Now, some applications will need better accuracy than others. For example, a full hybrid electric vehicle application tries to keep the cells within the operating window of 30% state of charge (SOC) to 70% SOC for example, and never tries to charge the pack up to exactly 100% SOC. However, a plug-in vehicle will of course try to charge each cell in the pack up to exactly 100% SOC. The reason why a plug-in vehicle wants to have each cell at exactly 100% SOC at the end of a charge is that in so accomplishing this, the vehicle will have the maximum range while not jeopardizing the cell. Within certain bounds, this is tantamount to saying that the more accurate the cell voltage can be measured in the function of determining the end of charge condition, the more capacity the pack can have. (Or, the more inaccurate the cell voltage is measured, the more margin needs to be placed on the threshold voltage used in determining 100% SOC for a given cell.) So, for a large pack, it may well make sense to pay for a precision reference in the circuit 48 to develop a precision reference voltage for the substrate board 16. As an example, the choice of the reference voltage in the circuit 48 and the accuracy of the A/D conversion (or voltage measurement function) in the circuit block 46 may be specified to be able to determine the voltage of Cell 1 to within ±10 mV under all conditions, which would be fairly accurate for a plug-in application. It is the case that a full hybrid electric vehicle application may be able to get by with less accuracy than this, for example, ±100 mV. So, if a common hardware design is created for the substrate board 16, in order to accommodate the more accurate plug-in application, the circuit 48 may populate a precision bandgap reference in the generation of a precision reference voltage which comes out of the block 48 and is presented for use in the circuit block 46 by its voltage measurement function. However, a battery pack manufacturer may elect to depopulate the precision reference in the circuit 48, thereby not generating a precision voltage. This would be coordinated with a software change in the circuit block 46 so that instead a different, lower accuracy reference inside the circuit block 46 is used. This choice is a tradeoff between the costs of the substrate board 16 and the need for accuracy by the application. In sum, the watch crystal 44 can be optional depending on the need for timekeeping accuracy in sleep by the application, (and as well, bandgap reference 50 in FIG. 3 is optional depending on the need for cell voltage measurement accuracy by the application).

A few more comments can be made regarding the high-level blocks in the substrate board circuits. Cell 1 is the item being measured, and the voltage of cell 1 is an input to the block 48. Also, the substrate board 16 is powered from the same two nodes that connect to cell 1. There is a voltage Vsns which comes out of the circuit 48 and goes into the circuit block 46. This Vsns voltage is intended to be the same voltage as the positive lead of cell 1. Vpwr, coming out of the circuit 48 and going into the circuit block 46, is the power supply to run the processor, radio, etc. This power supply can get interrupted (intentionally) if the circuit block 46 asserts the functional safety watchdog (FSWD) signal FSWD. The purpose of the FSWD is to be able to shut down the power supply if it is determined the substrate board 16 is not working correctly, which is an implementation of a complete power down for the circuit block 46. This type of complete power down is intended to restore the substrate board 16 to its boot-up state. If the FSWD indicates a problem, the recourse is to power down the processor.

The circuit block 46 contains the processor, a radio, and what is referred to as auxiliary functions. The auxiliary functions include the A/D conversion of the cell voltage attached to the substrate board 16 via the Vsns input to the circuit block 46, a general purpose digital input/output port used as a digital output for activating the cell balance function for the substrate board 16, also referred to as CBctl, and the FSWD. The FSWD output is operated by a circuit in the auxiliary functions which is designed to pulse when the processor software is detected to not be operating properly. This pulsing of the FSWD output of the processor, to the FSWD input of the block 48, will cause the block 48 to interrupt the power supply long enough to guarantee a complete power down of the processor in the circuit block 46. The block 48 is designed in such a fashion that even if the circuit block 46 is faulted and leaves the FSWD output permanently asserted, the power circuits such as Vpwr and Vref will be able to operate. The function of the block 48 is arranged so that the Vpwr and Vref are turned off only for a fixed duration in time, for example 100 mS after a pulse on the FSWD output on the circuit block 46. So, Vpwr provides the power to operate the processor, auxiliary circuits, and radio in the circuit block 46. Vsns is the same potential as Cell 1, and an auxiliary function of the circuit block 46 is to perform an A/D conversion on this voltage Vsns, which results in the measurement of the cell voltage, which is a primary function of the substrate board 16. The circuit block 46 utilizes the Vref input in this A/D conversion function.

As mentioned above, the precision bandgap reference 50 in FIG. 3 is optional; and if it is depopulated, then the Vref signal from the block 48 is invalid. When Vref is invalid, the circuit block 46 is engineered to automatically switch over to its own internal, and less accurate, reference. The CBctl digital output from the circuit block 46 is under the control of software that runs on the processor in the circuit block 46. As mentioned above, the crystal 42 used for the RF communications from the circuit block 46. The crystal 42 is also used as a system clock for the processor in the circuit block 46. The crystal 44 is optional and is a watch crystal used for a low power real-time clock to keep accurate time when the processor in the circuit block 46 is sleeping, if this is useful for the application. If this feature is not needed, the crystal 44 may be depopulated. Signal RFtxrx coming from the circuit block 46 is from the radio in circuit block 46. It is a bidirectional signal which can function as a transmitted signal coming from the radio, or as the input signal to the radio. As alluded to earlier, the RFtxrx signal is connected through a coupler circuit 54 to both the power line carrier (PLC) bus interface 56 which is to the (+) cell input to the substrate board 16, which is the high voltage bus of the battery pack 10; and at the same time, the RFtxrx is connected to antenna circuit 58. This simultaneous connection to both the antenna circuit 58 and the HV bus 32, 35 through the coupler circuit 54 allows a fraction of the signal energy to travel out on the HV bus 32, 35, and a fraction to exit the substrate board 16 through the wireless antenna 58. Similarly, received energy can enter the substrate board 16 either through the HV bus 32, 35 or through the antenna 58. That is, RF energy from the block 46 is directed to the coupler circuit 54. The coupler circuit 54 can then selectively direct that energy to either or both the antenna circuit 58 and PLC bus interface 56, which is the gateway to driving the RF energy on the high voltage bus 32, 35 for communication with other substrate boards for other cells, and the vehicle more generally. The coupler circuit 54 is frequency selective in that it may lower the frequency content associated with the RF energy to permit it to flow to the PLC bus interface 56.

Referring to FIG. 3, the details of the power supply portion are revealed. The cell input to the substrate board 16, for instance cell 1, are attached through Cell+ lead 60 and Cell− lead 62. Interestingly, these 2 pins are the only wired interface between the substrate board 16 and the rest of the system. The only other interface to the system is wireless RF communications. A certain amount of RF energy is intended to travel through the connections 60 and 62. Also, the power to operate the substrate board 16 is drawn from the individual cell and flows through the connection 60 (+) and connection 62 (−). It should be observed that the node 60 or cell+ is connected through current limiting resistor Rlim 64 and connected the Vsns, which goes over to the circuit block 46 for measurement. It should be noted that the potential at the node Vsns is with respect to the node 62, which is the ground reference for the entire substrate board 16.

The node 62 is locally grounded. Generally, any circuit in the substrate board 16 that needs a ground reference will use the node Cell− 62. The cell balancing functionality of the block 48 is implemented by switch SWcb 70, which may be implemented with a N-channel MOSFET. Burden resistor Rcb 72 completes the cell balance circuit. Notice that if the signal CBctl which comes from the circuit block 46 is active, then the SWcb 70 activates, which connects the Rcb 72 across the cell 14 through the connections 60, 62, thereby applying a passive ohmic load of a certain amount, for example 8 mA. This current is referred to the as the cell balance capability of the substrate board 16 and it can easily be set by adjusting the ohmic value of the Rcb 72. However, the power dissipated goes as $(Vcell^2)/Rcb$, where Vcell is the voltage of the cell 14.

Control block 80 is shown which controls a pass switch 82. For instance, the pass switch 82 could be implemented as a P-channel MOSFET. The high-level details for the control block 80 are mentioned here, which can readily be implemented by one skilled in the art. The cell voltage from connections 60, 62 is read by a connection from the control block the 80 to the node 60. This allows the control block 80 to act when Cell 1 is too low in voltage, for instance by opening the pass switch 82. As well, the control block 80 reads in the FSWD command signal from the circuit block 46. This signal will pulse when the circuit block 46 wants to command a momentary power shutdown to perform a hardware restart of the system. However, if the FSWD 48 stuck in the active state owing to a fault, the control block 80 will turn the pass switch 82 on to allow the substrate board 16 to operate. However, the processor in circuit block 46 will need to detect that the FSWD feature is not working. One method is to set a digital "1" in some register that is known to assume a "0" value any time the processor resets. When the FSWD activates, the software can ascertain if the memory location remains 1, which means that the power never got shut off and the FSWD did not work. When the FSWD does not work, diagnostics need to be set and the central module BECM 20 should be notified of the hardware issue. The basic feature of the control block 80 is that if the cell voltage is normal and the FSWD signal has not pulsed, then it activates the pass switch 82 to connect power to Vpwr and to active Vref. Note that the bandgap reference 50 is arranged in conjunction with resistor Rpu 90, for example 1.8 kohms, to create the reference voltage Vref when the pass switch 82 is activated.

Figure 4A:
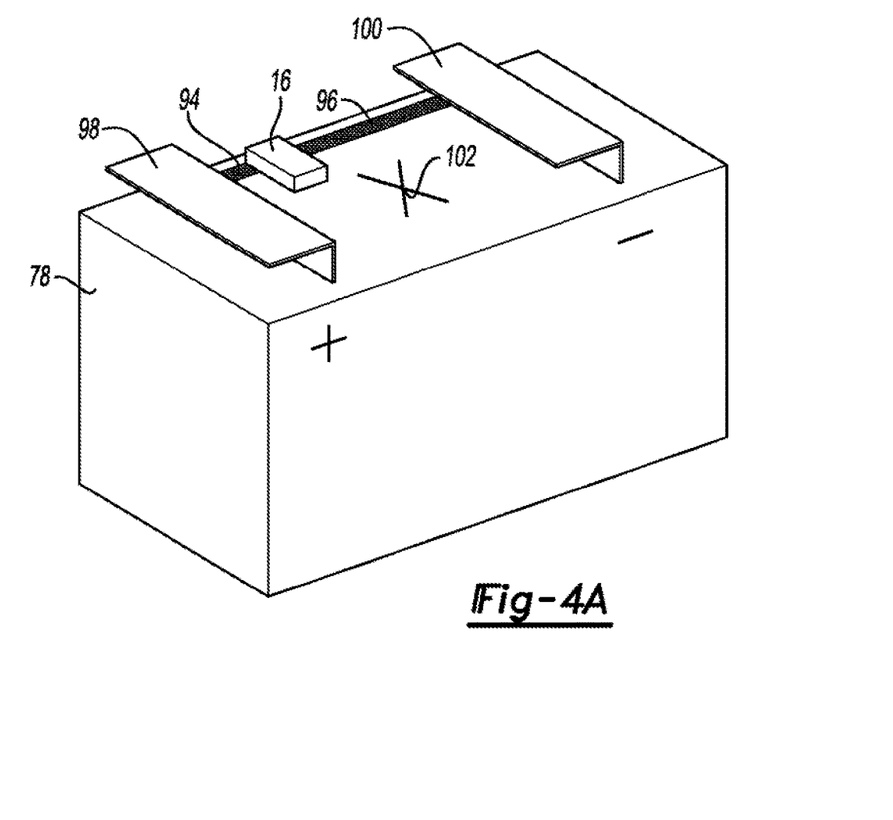
FIG. 4A is a perspective view of a battery cell system.
Figure 4B:
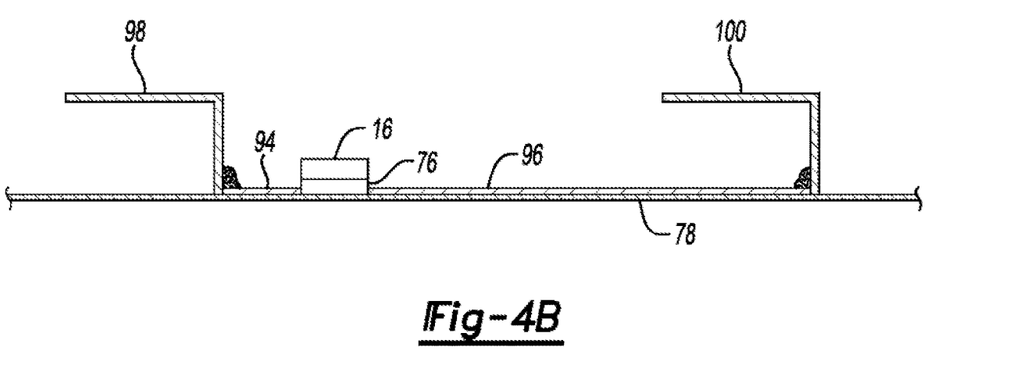
FIG. 4B is a side-view, in cross-section, of a portion of the battery cell system of FIG. 4A.

Referring to FIGS. 4A and 4B, the mounting scheme for the substrate board 16 on the cell 14 is shown. A thermally conductive material such as a thermal epoxy or SIL-PAD 76 is between the substrate board 16 and the cell top in certain implementations. To the extent additional power is dissipated in the cell balance circuit 70, 72, it is important that this heat be removed from the substrate board 16 through the thermal bond 76. Container or can 78 of the cell 14 has a reasonable amount of surface area, and so it may be able to directly dissipate the heat generated in the cell balance circuit 70, 72. However, if the can 78 cannot dissipate this heat, then some sort of cooling mechanism, such as air or liquid cooling, should be devised to keep the cell 14 cool.

The substrate board 16 is mounted on the cell 14 with thermal connection 76 (e.g., thermal epoxy) to allow heat removal from the substrate board 16. The cell 14 needs to have its voltage and temperature measured and the data wants to be sent to the central BECM 20. The substrate board 16 is encapsulated in a protective material and mounted on top of a can 78 of the cell 14. Flex cables 94, 96 are soldered to the substrate board 16 and come out of the packaged substrate board on opposite sides. The flex cable 94 is weld attached to cell tab 98, which is the positive terminal of the cell 14. The flex cable 96 is weld attached to cell tab 100, which is the negative weld tab of the cell can 78. The flex cable 94 is fastened tightly at both ends, and may be adhesively connected to the cell can 78. Generally, the flex cable 94 should be insulated to avoid shorts to the cell casing 78. The same comments apply to the flex cable 96. Notice that vent 102 for the cell 78 may open in a fault event. As such, to have the substrate board 16 over the vent 102 would be less than optimal. Therefore, as is depicted in FIG. 4A, the way that the encapsulated substrate board 92 is arranged with the flex cables 94, 96 in such a way that the cell vent 102 is avoided. When the encapsulated substrate board 16 is thermally mounted with the thermally conductive material 76, then the substrate board 16 is essentially at the same temperature as the cell can 78, and then an on-chip thermal measurement circuit in the processor of the circuit block 46 is able to directly read the cell temperature, as the processor in the circuit block 46 is essentially the same temperature as the cell can 78.

Referring again to FIG. 2, it is worth discussing the different alternatives for the radio in the circuit block 46. It has been already mentioned that RF propagation in the PLC mode through the PLC bus interface 56 may be utilized. For applications in which the most robust signal path is through the medium of the high voltage bus, a frequency band which promotes this propagation mode is the best choice. For example, some commercial implementations with carrier frequencies between 455 kHz and 30 MHz are a good choice for the PLC propagation mode. However, if an application is more appropriate for wireless links between the nodes that communicate, then 2.4 GHz is more appropriate. No limitations are placed on which frequency band the RF communications use, although usage of frequencies somewhere in the range of 455 kHz to 2.4 Ghz would make it easier to find existing solutions from silicon manufactures. Also, the protocol for the communications is flexible according to the needs of the application. There are some existing protocols for power line carriers which may be able to be utilized for applications that make RF links over the wiring. For communications at 2.4 Ghz, there are several popular alternatives including Bluetooth and IEEE 802.15.4. No distinctions are made here between the different protocols available. An aspect of the use of these communication protocols is that they are used to create a data link from the substrate board 16 to another radio transceiver, to create a data link to the central BECM 20. As mentioned above, this may be implemented as a direct RF link from the substrate boards to the central BECM 20, or the approach may utilize mesh networking between the peer substrate boards in order to create a data link to the central BECM 20.

As mentioned above, the substrate board 16 is a mounting means for the electronic circuits made of ceramic, FR4, or some other suitable surface to mount silicon dies, surface mount components, and everything else specified in this text. The connection from Cell 1 to the substrate board 16 is through the flex cables 94, 96 that can be welded or soldered on either end. The PLC bus interface 56, power block 48, and coupler circuit 54 are conventional electronic circuits, formulated of surface mount components as appropriate. The crystals 42 and 44 are typical surface mount devices. The antenna circuit 58 has a number of alternatives. First, the antenna circuit 58 may be constructed of stripline, which are the traces on the substrate board 16. Alternatively, for a given application which may require better antenna performance, a chip antenna may be utilized. For the circuit block 46, the greatest amount of flexibility is called for. The implementation may be a single monolithic piece of silicon, a Bluetooth Low Energy (BLE) radio, or analog/digital arrays with which to carry out the auxiliary functions. Alternatively, a bare die low cost microprocessor may be used, along with a separate bare die for the radio function. The goal is to find bare die that are commercially available for the processor and radio functions and place these on the substrate board 16 to implement the function in the most compact and least expensive way. The auxiliary functions as cited in the circuit block 46 are often offered as a peripheral feature along with commercially available embedded processors.

Figure 5:
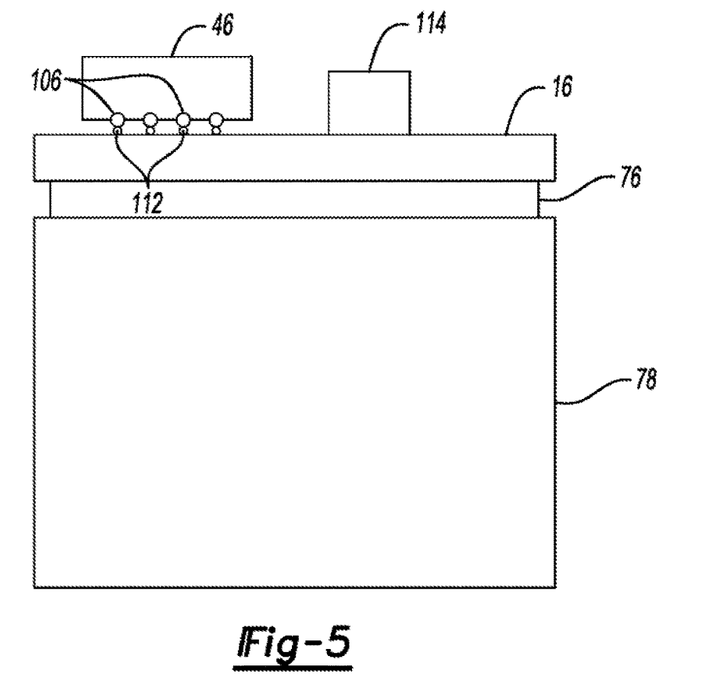
FIGS. 5 and 6 are side views of battery cell systems.

With reference to FIGS. 3 and 5, the monolithic semiconductor 46 that measures cell parameters (e.g., temperature, current, voltage, etc.) data, processes the data, and communicates (wired or wirelessly) information derived therefrom off die is mounted on the (metal) cell case 78. There are a few mounting methods. The integrated circuit 46 can be mounted via solder bumps 106 to the (ceramic) substrate 16. The substrate 16 can then be either directly mounted to the cell case 78 via the thermally conductive adhesive 76, or via a metal tab deposited on the underside of the substrate 16.

The thermal adhesive use case is for when there is no need to make an electrical connection from the case 78 to the substrate board 16. Here, the monolithic integrated circuit 46 needs to be mounted with a thermal connection to the cell can 78. The block 46 is mounted on the substrate board 16. The substrate board 16 is metallized on the topside (the side facing the block 46) with a conductive material such as copper, aluminum, or the like. This metallization layer on the topside of substrate 16 may be patterned via lithographic techniques to create traces and pads 112, which a die can be mounted on and connected to. Two techniques for making the node connections are solder bumps 106 on the underside of the block 46, or a bonding pad on the topside of the block 46 which may be wire-bonded to a conductive trace on the substrate board 16. Block 114 represents any additional component needed in the circuit along with the monolithic integrated circuit 46, such as a crystal, a transistor switch, or other components (see FIG. 2).

Figure 6:
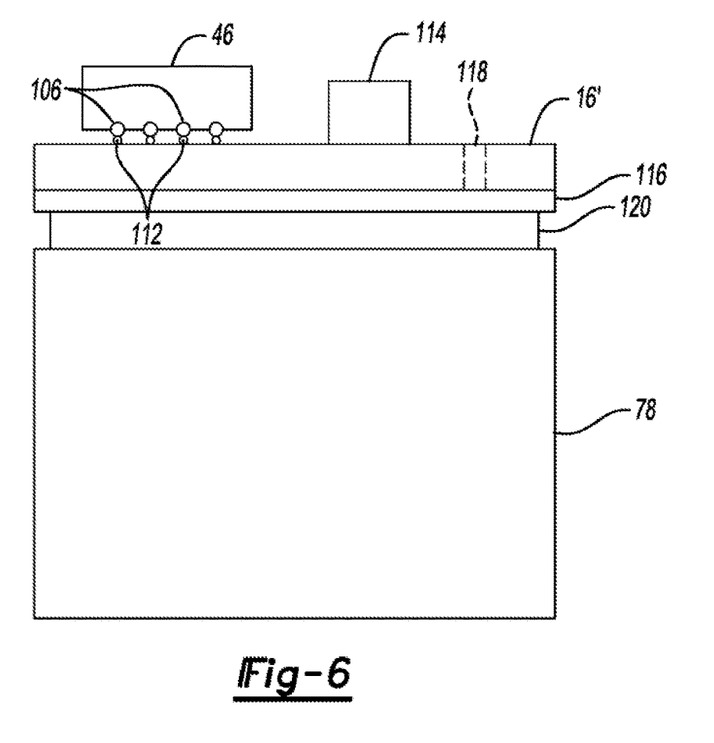

Referring to FIG. 6, a conductive adhesive mounting is shown. This use case is for when there is a need to make an electrical connection from the metal case 78 to the substrate board 16'. An additional metallization layer 116 is added to the bottom side of substrate board 16'. Additionally, one or more vias 118 extend from the metallized layer 116 to the tracks or circuits 112 on the topside of substrate board 16'. Here, the monolithic integrated circuit 46 needs to be mounted with an electrical and thermal connection 120 to the cell can 78. The substrate board 16' may be prefabricated with metallization layer 112 on the top and the metallization layer 116 on the bottom, which are patterned appropriately before using for mounting the circuits and connecting to the cell can 78. Here, the layer 120 is an adhesive that is thermally and electrically conductive, for example, by suspended carbon particles of appropriate size in the adhesive.

Figure 7:
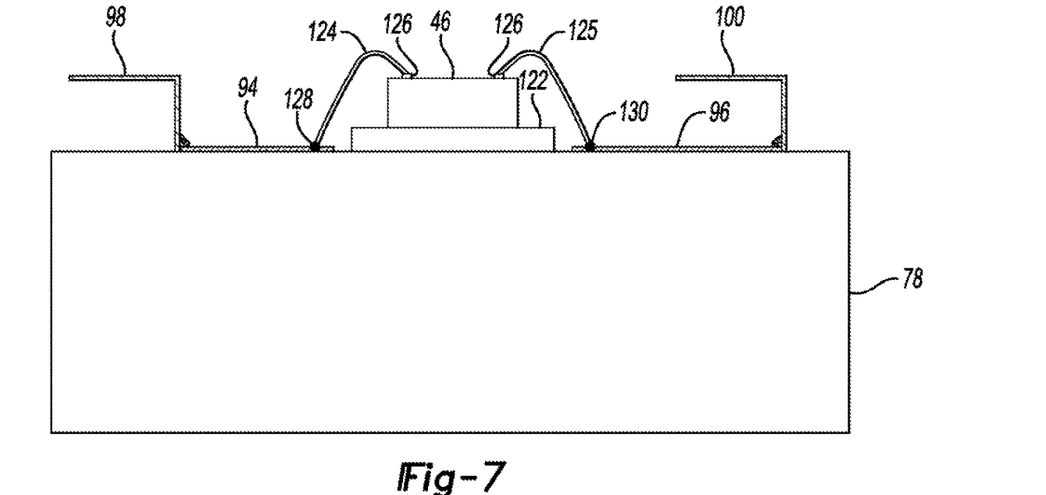
FIG. 7 is a side view, in partial cross-section, of a battery cell system.

Referring to FIG. 7, a direct die mounting technique is shown. The basic concept is that the monolithic integrated circuit 46 is directly mounted via a thermally conductive adhesive 122 onto the metal cell can 78. Here, the die 46 is connected to the cell tabs 98, 100. This will be done via wire bonds 124, 125. However, the wire bonds 124, 125 need a target next to the die 46 so they can on one end solder to pad 126 on the integrated circuit 46; and on the other side, to respective metallic pads 128, 130 on flexible printed circuits 94, 96. The positive weld tab 98 on the cell can 78 is joined with the flexible printed circuit 94 via a weld or solder joint as mentioned above. The flexible printed circuit 94 is a flexible circuit trace which is adhesively connected to the cell can 78. The flexible printed circuit 94 has a conductive trace inside it, but this conductive trace is surrounded by insulative material so that there is no electrical connection made from it to the metal can 78. So, the node of the positive weld tab 98 is connected to the flexible printed circuit 94, and it brings the signal to a spot close to the integrated circuit 46. The flexible printed circuit 94 has an opening that exposes this internal metal layer, which the wire bond 124 is soldered or welded to at the pad 128. Similarly, the negative weld tab 100 for the cell can 78 is connected to the flexible printed circuit 96 via weld or solder joint. The flexible printed circuit 96 brings the negative cell terminal connection to a spot close to the monolithic integrated circuit 46. The wire bond 125 connects the pad 126 to the pad 130, and this completes the electrical connection of the integrated circuit 46 to the cell terminals 98, 100. The thermal adhesive 122 makes a good thermal connection from the block 46 to the can 78, but electrical insulation from the block 46 to the can 78 is desired. So the adhesive 122 is not electrically conductive.

Referring again to FIGS. 3 and 4, the traction battery pack 10 includes the battery monitoring circuit 46 that measures voltage, temperature, etc. of a single cell (that exclusively powers the monitoring circuit 46), and a front-end pass switch 82 (a pass switch positioned between the cell and monitoring circuit) that disconnects power to the monitoring circuit 46 under certain circumstances such as low cell voltage or an issue detected by a safety monitor, which could be implemented in software or hardware. Examples of safety monitoring include monitoring for overvoltage, overpressure, overcurrent, overtemperature, proper operation of a safety watchdog, etc. Associated predefined threshold values can be established through testing or simulation, for example. Exceeding these threshold values would result in opening of the pass switch 82.

Figure 8:
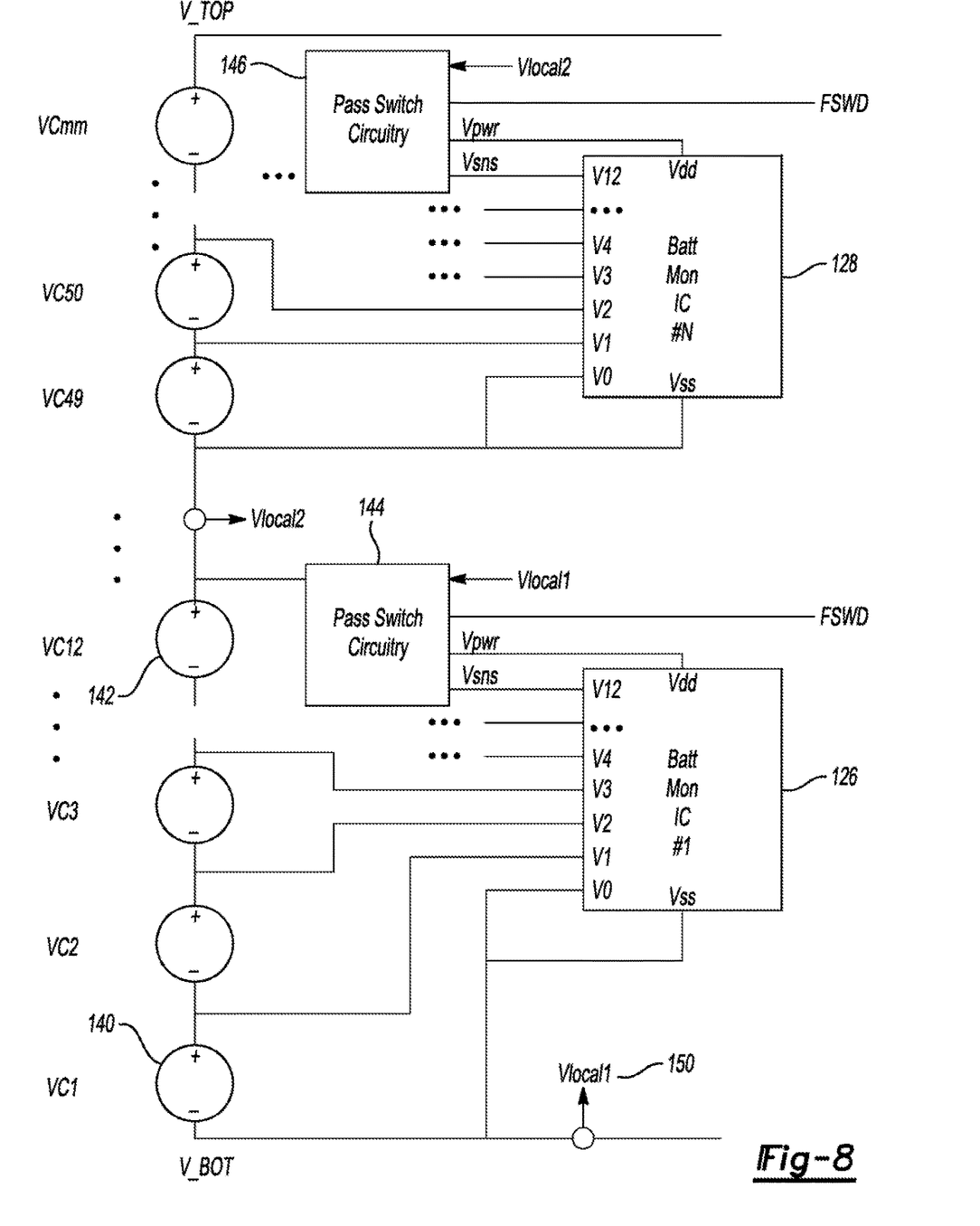
FIG. 8 is a schematic diagram of a battery monitoring integrated circuit.

Referring to FIG. 8, the pass switch concept also can be applied to conventional battery monitoring integrated circuits. Here, we find an implementation of a conventional battery monitoring integrated circuit (BMIC) 136, 138 which have the proposed pass switch applied to them. That is, we apply the pass switch concept to BMIC technology. This is used in a traction battery pack comprised of cells 140, 142 arranged in a string from VC1 to VCmm. There are one or more BMIC's 136, 138 which monitor the cells and which communicate the cell voltage readings back to a central controller. Block 144, which is a pass switch circuit, is interjected between the top cell in a substring and a Vdd pin of the BMIC 136. In this example, the string of 12 cells with the cell 140 at the bottom and the cell 142 at the top, or cells VC1-VC12, are used to power the BMIC 136 with a reference of the Vss pin of the BMIC 136 connected to V_BOT, which is the minus terminal on the cell 140, and the power connection or the Vdd pin of the BMIC 136 connected to the pass switch circuit. Here, we see that the pass switch circuit 144 opens and closes the connection from the substring VC1 to VC12 to the power pin or Vdd of the BMIC 136. That is, the pass switch circuit 144 can disconnect the power source from the BMIC 136. Also in this example, every BMIC in the stack, for example the BMIC the 138, has a similar pass switch circuit to go with it.

Notice that the pass switch circuit 144 might remind one of the power switch circuit 82 in FIG. 3. However, it is not the same. This is because the pass switch circuit 82 is optimized for a single-cell battery pack sensing module peer-to-peer application. The pass switch circuit 144 is optimized to use with the BMICs 136, 138.

Figure 9:
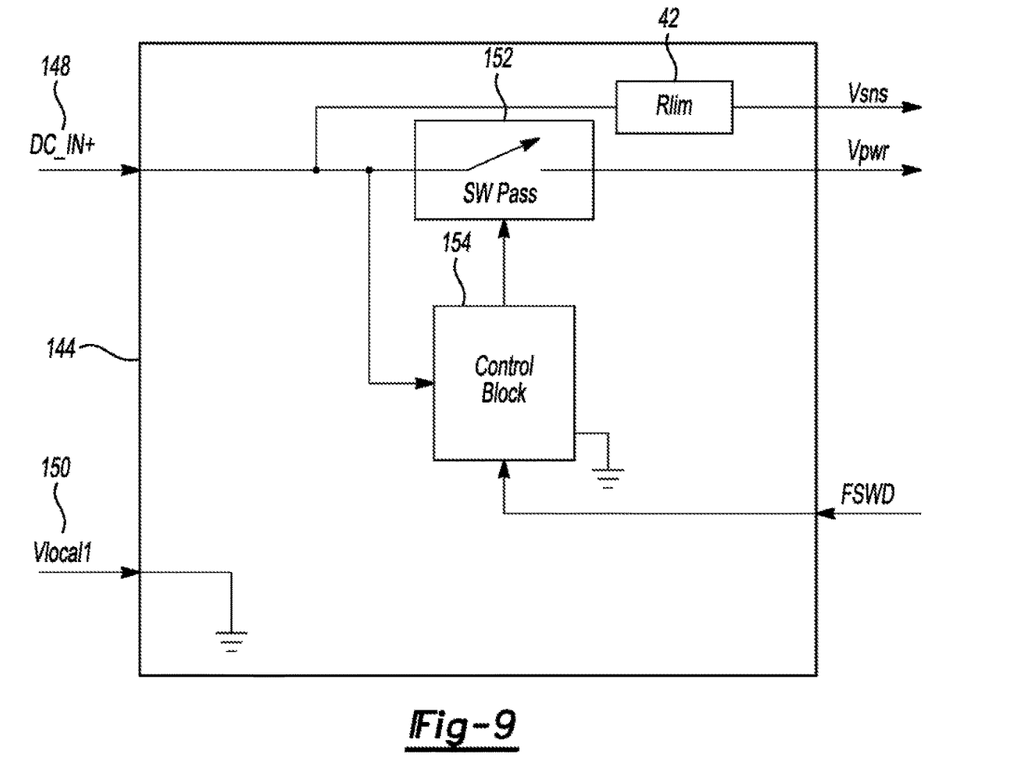
FIG. 9 is a schematic diagram of one of the pass switch circuits of FIG. 8.

Referring to FIG. 9, power input connection to the block 144 is through DC_IN+ 148. This corresponds to the positive terminal of the cell 142 (VC12). We see also that Vlocal1 150 is connected to the negative pin on the cell 140 VC1 (VC1/V_BOT), which here is the lowest potential in the overall cell string VC1 through VCmm. The power source for the pass block comes in via DC_IN+ 148 and Vlocal1 150. The Vlocal1 150 is the reference or local ground and DC_IN+ 148 is the combination power source and measurement point for the node at the top of the cell 142 (VC12). The DC_IN+ node 148 connects to a pass transistor 152 in the block 144. The switch 152 is controlled by control block 154. The control block 154 measures the voltage of the DC_IN+ 148. It uses this voltage to make the decision to open the pass switch 152 if the voltage DC_IN+ 148 falls below a certain voltage, for example, 1.0 volt per cell. So, with 12 cells VC1 through VC12, 1.0 volt per cell*12 cells=12V. This gives the possibility of opening the pass switch 152 when the group of 12 cells VC1 through VC12 falls below an average voltage of 1V each. The reason why one might like to do this is because when the cells are that low, the BMIC 144 is likely over discharging these cells to obtain its own power. Therefore, it is an excellent protection feature for the control block 154 to command the pass switch 152 when the voltage of the DC_IN+ 148 compared to the Vlocal1 150 falls below for example 12V to protect the cells against over discharge. There are certain modes of the BMIC 136, caused by issues during manufacture or caused by electrical overstress in the usage of the BMIC 136, that may cause excessive current draw on the Vdd (power) pin of the BMIC 136. In this instance, to prevent issues with the cell string VC1 through VC12, the BMIC 136 is disconnected using the pass switch circuit 152. Therefore, this provides much utility by protecting the cells and allowing replacement of the electronics module that contains the BMIC 136.

The FSWD is a control input to the control block 154. This FSWD is shown here as a common signal that connects to a number of pass switch circuits such as 144, 146. This can be implemented as an interface signal that is common and which is able to drive a signal into each of the control blocks. For example, a signal which is referenced to the Vlocal1 150, also known as V_BOT, can be connected to all the control blocks through a high impedance or even through optoisolation in each control block to prevent interaction between the different control blocks. The FSWD can be connected to a central control module such as a BECM so that in the event of a battery pack safe state event, it may choose to disconnect all the BMICs by opening all of the pass switches. This is done through the FSWD signal. The central module may send a heartbeat message on the FSWD signal when the system is in a normal state. But, when the central module does not send a proper heartbeat signal, the control blocks will then open the pass switches. In this way, we implement a reliable way for the BMIC to stop drawing power from the cells in the event of a safe state event.

In addition, the control blocks may be arranged to open the pass switches under any desired fault event. So far, we have described the usage of the control block 154 to open the pass switch 152 under the event of undervoltage on the DC_IN+ 148 and as well, the loss of a heartbeat signal on the FSWD. However, there could be any number of other signals that the control block 154 may decide to monitor for opening the pass switch 152, such as the temperature of the circuit through an internal thermistor located in the control block 154, or by monitoring the current through the pass switch 152 via a measurement of the Vds drop of the transistor (not shown), or any other appropriate means of noticing that something is wrong in the circuitry.

Figure 10A:
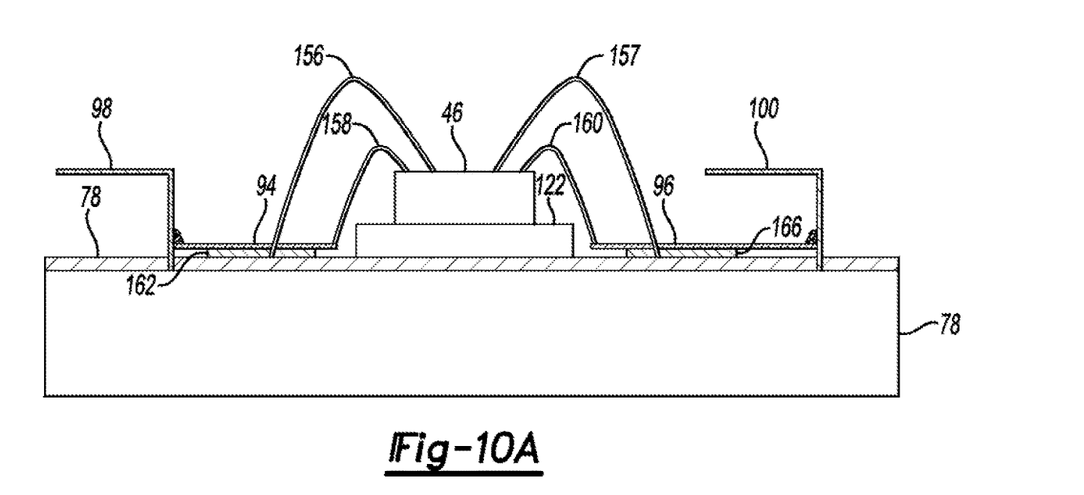
FIG. 10A is a side-view, in partial cross-section, of a battery cell system.
Figure 10B:
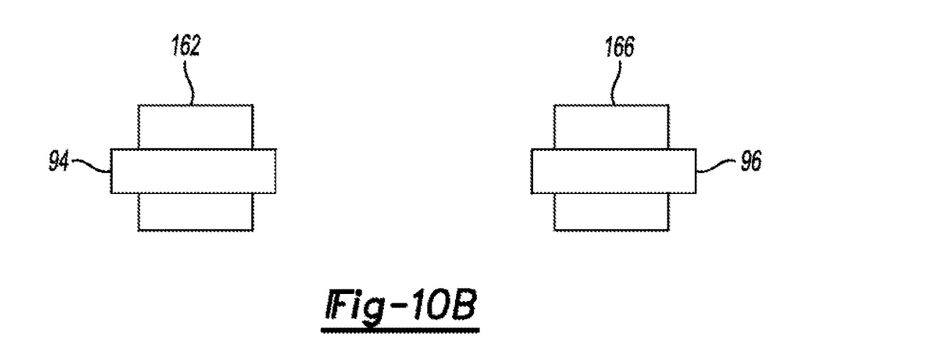
FIG. 10B is a top view of a portion of the battery cell system of FIG. 10A.

Referring to FIGS. 10A and 10B, the flex leads 94, 96 (e.g., flexible flat metal conductors represented by the hatching surrounded by a dimensionally controlled insulative material represented by the outline surrounding the hatching, with adhesive on one side) are directly attached to the cell can 78 such that the assembly of the flex leads 94, 96 and their attached ground plane can exhibit controlled impedance characteristics. Further, the proximity of the flat metal conductors relative to an attached ground plane provides electromagnetic shielding of the flex leads. Thus, the arrangement yields a low Z connection from the substrate board 16 to the cell weld tabs 98, 100 and shielding of the signal from the weld tabs 98, 100 to the substrate board 16, which may facilitate obtaining a low noise, accurate reading from the cell 14.

Two wire bonds 156, 157 connect to a node on the block 46 which is the reference or ground of the transmitter circuit. Wire bond 158 is the node to connect to the cell+ 98. Wire bond 160 is the node to connect to the cell− 100. Ground plane 162 is below the plus signal. Notice that the ground plane 162 is implemented in a conductor layer of the flexible printed circuit 94. The trace on the top of the flexible printed circuit 94 only connects to the positive cell terminal 98, and is insulated from the ground reference 162. Ground plane 166 is a layer under the flexible printed circuit 96. The signal layer in the flexible printed circuit 96 connects the wire bond 160 from the cell− connection on the integrated circuit 46 to the cell tab 100.

The thermal adhesive layer 122 separates the block 46 from the cell can 78. It also insulates and prevents any connection from the flexible printed circuits 94, 96, and the ground planes 162, 166 to the cell can 78: They are all insulated from the can 78. Notice that the ground planes 162, 166 are connected to each other through their connection via wire bonds 156, 157 to the ground reference of the block 46, but the flexible circuit 94 is not electrically connected to the flexible circuit 96. Thus, a stripline antenna which has controlled impedance characteristics is formed. It may be used to transmit RF out of the circuit 46 through the dipole formed by the flexible circuits 94, 96. The ground planes 162, 166 are part of the dipole antenna circuit. The ground plane 162 and flexible printed circuit 94 form a stripline antenna, as do the ground plane 166 and the flexible printed circuit 96.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure and claims. As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A battery system comprising:
   a cell;
   a central control module;
   a substrate board directly mounted on the cell;
   monitoring circuitry on the substrate board and exclusively powered by the cell;
   a switch on the substrate board electrically between the cell and monitoring circuit;
   control circuitry on the substrate board configured to, responsive to a value of a parameter of the cell measured by the monitoring circuitry falling outside a predefined range, open the switch to electrically disconnect the monitoring circuit from the cell; and
   a coupler circuit on the substrate board configured to direct a portion of signal energy from the monitoring circuitry to an antenna circuit and to direct another portion of the signal energy to a power line carrier bus interface electrically connected with a voltage bus such that propagation of the portion of the signal energy from the coupler circuitry to the central control module occurs via the antenna circuit and propagation of the another portion of the signal energy from the coupler circuitry to the central control module occurs via the voltage bus, wherein the signal energy is indicative of the value and wherein the voltage bus electrically connects the cell to other cells of the battery system.

2. The battery system of claim 1, wherein the control circuitry is further configured to, responsive to a watch dog signal, open the switch.

3. The battery system of claim 1, wherein the parameter is voltage.

4. The battery system of claim 1, wherein the parameter is current.

5. The battery system of claim 1, wherein the parameter is temperature.

6. The battery system of claim 1, wherein the parameter is pressure.

7. A battery system comprising:
a cell;
a central control module;
a substrate board directly mounted on the cell;
monitoring circuitry on the substrate board, exclusively powered by the cell, and configured to measure data about the cell;
a switch on the substrate board electrically between the cell and monitoring circuit;
control circuitry on the substrate board configured to, responsive to a signal, open the switch to electrically disconnect the monitoring circuit from the cell; and
a coupler circuit on the substrate board configured to direct a portion of signal energy from the monitoring circuitry to an antenna circuit and to direct another portion of the signal energy to a power line carrier bus interface electrically connected with a voltage bus such that propagation of the portion of the signal energy from the coupler circuitry to the central control module occurs via the antenna circuit and propagation of the another portion of the signal energy from the coupler circuitry to the central control module occurs via the voltage bus, wherein the signal energy contains the data and wherein the voltage bus electrically connects the cell to other cells of the battery system.

8. The battery system of claim 7, wherein the control circuitry is further configured to, responsive to a value of the data falling outside a predefined range, open the switch.

9. The battery system of claim 7, wherein the data includes voltage.

10. The battery system of claim 7, wherein the data includes temperature.

11. The battery system of claim 7, wherein the data include pressure.

* * * * *